(12) United States Patent
Kobayashi et al.

(10) Patent No.: US 12,349,514 B2
(45) Date of Patent: Jul. 1, 2025

(54) LIGHT EMITTING DEVICE, PROJECTOR, AND DISPLAY

(71) Applicant: Seiko Epson Corporation, Tokyo (JP)

(72) Inventors: Koichi Kobayashi, Fujimi (JP); Takashi Miyata, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 463 days.

(21) Appl. No.: 17/705,635

(22) Filed: Mar. 28, 2022

(65) Prior Publication Data

US 2022/0310880 A1 Sep. 29, 2022

(30) Foreign Application Priority Data

Mar. 29, 2021 (JP) .................. 2021-054828

(51) Int. Cl.
*H01S 5/34* (2006.01)
*G03B 21/20* (2006.01)
(Continued)

(52) U.S. Cl.
CPC ..... *H10H 20/8312* (2025.01); *G03B 21/2033* (2013.01); *H10H 20/857* (2025.01)

(58) Field of Classification Search
CPC ....... H01L 33/382; H01L 33/62; H01L 33/42; H01L 33/58; H01L 33/08; H01L 33/38; H01L 33/20; H01S 5/11; H01S 5/0421; H01S 5/04253; H01S 5/18308; H01S 5/18319; H01S 5/18344; H01S 5/18394; H01S 5/185; H01S 5/2205; H01S 5/34; H01S 5/3412; H01S 5/343; H01S 5/04252; H01S 5/22; H01S 5/3054; H01S 5/3215; H01S 5/323; H01S 2301/176; H01S 5/04254; H01S 5/2009; H01S 5/2027;
(Continued)

(56) References Cited

U.S. PATENT DOCUMENTS 10,340,659 B1 * 7/2019 Lin ..................... H01S 5/18394
11,569,636 B2 * 1/2023 Miyata ................ H01S 5/34333
(Continued)

FOREIGN PATENT DOCUMENTS

JP 2008-078418 A 4/2008
JP 2009-105088 A 5/2009
(Continued)

*Primary Examiner* — Ajay Ojha
*Assistant Examiner* — Tsz K Chiu
(74) *Attorney, Agent, or Firm* — Harness, Dickey & Pierce, P.L.C.

(57) ABSTRACT

A light emitting device includes a substrate, a laminated structure which is provided to the substrate, and includes a light emitting layer, a first electrode which has contact with the laminated structure at an opposite side of the laminated structure to the substrate, and is configured to inject an electrical current into the light emitting layer, and a wiring layer which is electrically coupled to the first electrode, and has a light shielding property with respect to light generated in the light emitting layer, wherein the wiring layer is provided with a first opening part which the light emitted from the laminated structure passes through, and the first opening part is located inside an outer edge of the first electrode in a plan view.

7 Claims, 10 Drawing Sheets (51) Int. Cl.
*H01S 5/343* (2006.01)
*H10H 20/831* (2025.01)
*H10H 20/857* (2025.01)

(58) Field of Classification Search
CPC .............. H01S 5/34333; H01S 5/1042; H01S 5/04257; H01S 5/02345; H01S 5/02253; H01S 5/0232; H01S 5/02469; H01S 5/0652; H01S 5/2013; H10H 20/8312; H10H 20/857; H10H 20/855; H10H 20/813; H10H 20/831; H10H 20/819; H10H 20/833
See application file for complete search history.

(56) References Cited

U.S. PATENT DOCUMENTS

| | | | | |
|---|---|---|---|---|
| 11,575,247 | B2* | 2/2023 | Miyata | H01S 5/34333 |
| 11,624,973 | B2* | 4/2023 | Miyata | H01L 33/385 |
| | | | | 353/31 |
| 11,901,695 | B2* | 2/2024 | Miyata | H01S 5/11 |
| 12,068,575 | B2* | 8/2024 | Chen | H01S 5/343 |
| 2002/0031154 | A1 | 3/2002 | Yokouchi et al. | |
| 2003/0080099 | A1* | 5/2003 | Tanaka | H01L 21/02592 |
| | | | | 219/121.76 |
| 2003/0092210 | A1* | 5/2003 | Koide | H01L 33/08 |
| | | | | 438/42 |
| 2005/0194598 | A1* | 9/2005 | Kim | H01L 33/08 |
| | | | | 257/79 |
| 2006/0208273 | A1* | 9/2006 | Kang | H01L 33/08 |
| | | | | 257/103 |
| 2007/0201527 | A1* | 8/2007 | Hori | H01S 5/18333 |
| | | | | 372/102 |
| 2007/0248132 | A1* | 10/2007 | Kikuchi | H01L 33/007 |
| | | | | 438/150 |
| 2008/0096297 | A1* | 4/2008 | Schiaffino | H01L 33/382 |
| | | | | 438/22 |
| 2008/0273832 | A1 | 11/2008 | Kiyota et al. | |
| 2010/0303405 | A1* | 12/2010 | Tagami | G02B 6/4206 |
| | | | | 257/E31.127 |
| 2011/0012168 | A1 | 1/2011 | Armitage | |
| 2011/0169025 | A1 | 7/2011 | Kishino et al. | |
| 2012/0072931 | A1* | 3/2012 | Imada | G11B 5/314 |
| 2018/0198047 | A1* | 7/2018 | Danesh | H01L 33/24 |
| 2020/0115271 | A1 | 4/2020 | Koide et al. | |
| 2020/0373731 | A1* | 11/2020 | Noda | H01S 5/0261 |
| 2020/0403377 | A1* | 12/2020 | Wu | H01S 5/18347 |
| 2020/0412099 | A1* | 12/2020 | Miyata | H01S 5/04254 |
| 2020/0412100 | A1* | 12/2020 | Miyata | H01S 5/185 |
| 2021/0096452 | A1* | 4/2021 | Miyata | H01L 33/62 |
| 2021/0194209 | A1* | 6/2021 | Miyata | H01S 5/423 |
| 2021/0391689 | A1* | 12/2021 | Arakida | H01S 5/18311 |
| 2022/0173266 | A1* | 6/2022 | Miyata | H01L 33/36 |

FOREIGN PATENT DOCUMENTS

| | | |
|---|---|---|
| JP | 2009-231773 A | 10/2009 |
| JP | 2010-010657 A | 1/2010 |
| JP | 2013-239718 A | 11/2013 |
| JP | 2019-001675 A | 1/2019 |
| JP | 2019-029516 A | 2/2019 |

* cited by examiner

LIGHT EMITTING DEVICE, PROJECTOR, AND DISPLAY

The present application is based on, and claims priority from JP Application Serial Number 2021-054828, filed Mar. 29, 2021, the disclosure of which is hereby incorporated by reference herein in its entirety.

BACKGROUND

1. Technical Field

The present disclosure relates to a light emitting device, a projector, and a display.

2. Related Art

Semiconductor lasers are promising as high-luminance next-generation light sources. In particular, a semiconductor laser to which nano-columns are applied is expected to be able to realize narrow-radiation angle high-power light emission due to an effect of a photonic crystal derived from the nano-columns.

For example, in JP-A-2013-239718, there is described a semiconductor optical element array provided with a plurality of nano-columns constituted by fine columnar crystal including an n-type cladding layer such as an n-type AlGaN, an active layer, and a p-type semiconductor layer including a p-type cladding layer such as p-type AlGaN. On the plurality of nano-columns, there is disposed a A-side electrode.

In the semiconductor optical element array having the plurality of nano-columns, there exists a nano-column overlapping an outer edge of the p-side electrode in a plan view. Such nano-columns are thinned due to, for example, over-etching when forming the p-side electrode in some cases.

SUMMARY

A light emitting device according to an aspect of the present disclosure includes a substrate, a laminated structure which is provided to the substrate, and includes a light emitting layer, a first electrode which has contact with the laminated structure at an opposite side of the laminated structure to the substrate, and is configured to inject an electrical current into the light emitting layer, and a wiring layer which is electrically coupled to the first electrode, and has a light shielding property with respect to light generated in the light emitting layer, wherein the wiring layer is provided with a first opening part which the light emitted from the laminated structure passes through, and the first opening part is located inside an outer edge of the first electrode in a plan view.

A projector according to another aspect of the present disclosure includes the light emitting device according to the above aspect.

A display according to another aspect of the present disclosure includes the light emitting device according to the above aspect.

DESCRIPTION OF EXEMPLARY EMBODIMENTS

A preferred embodiment of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. Light Emitting Device

1.1. Overall Configuration

Figure 1:
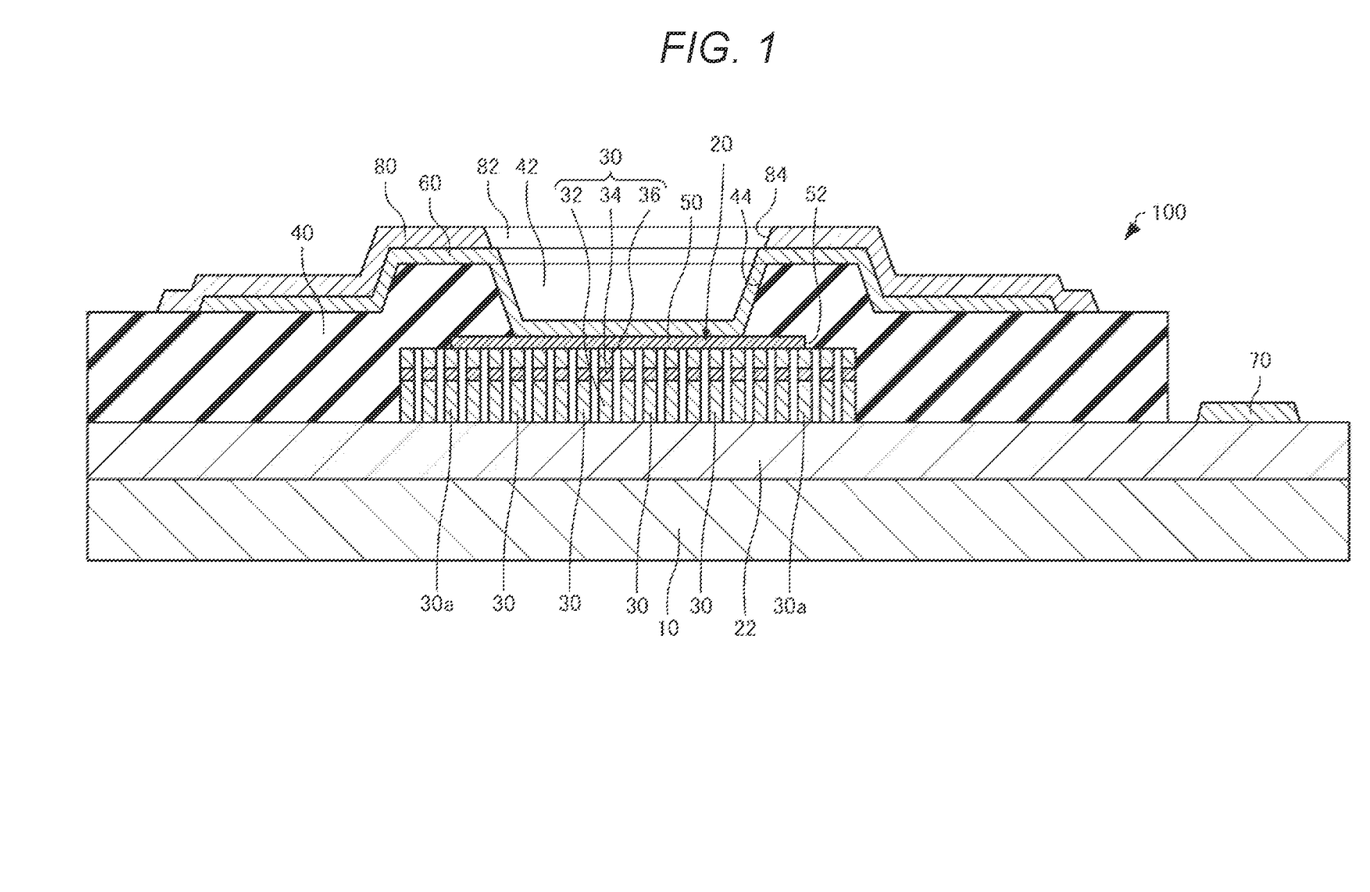
FIG. 1 is a cross-sectional view schematically showing a light emitting device according to an embodiment.
Figure 2:
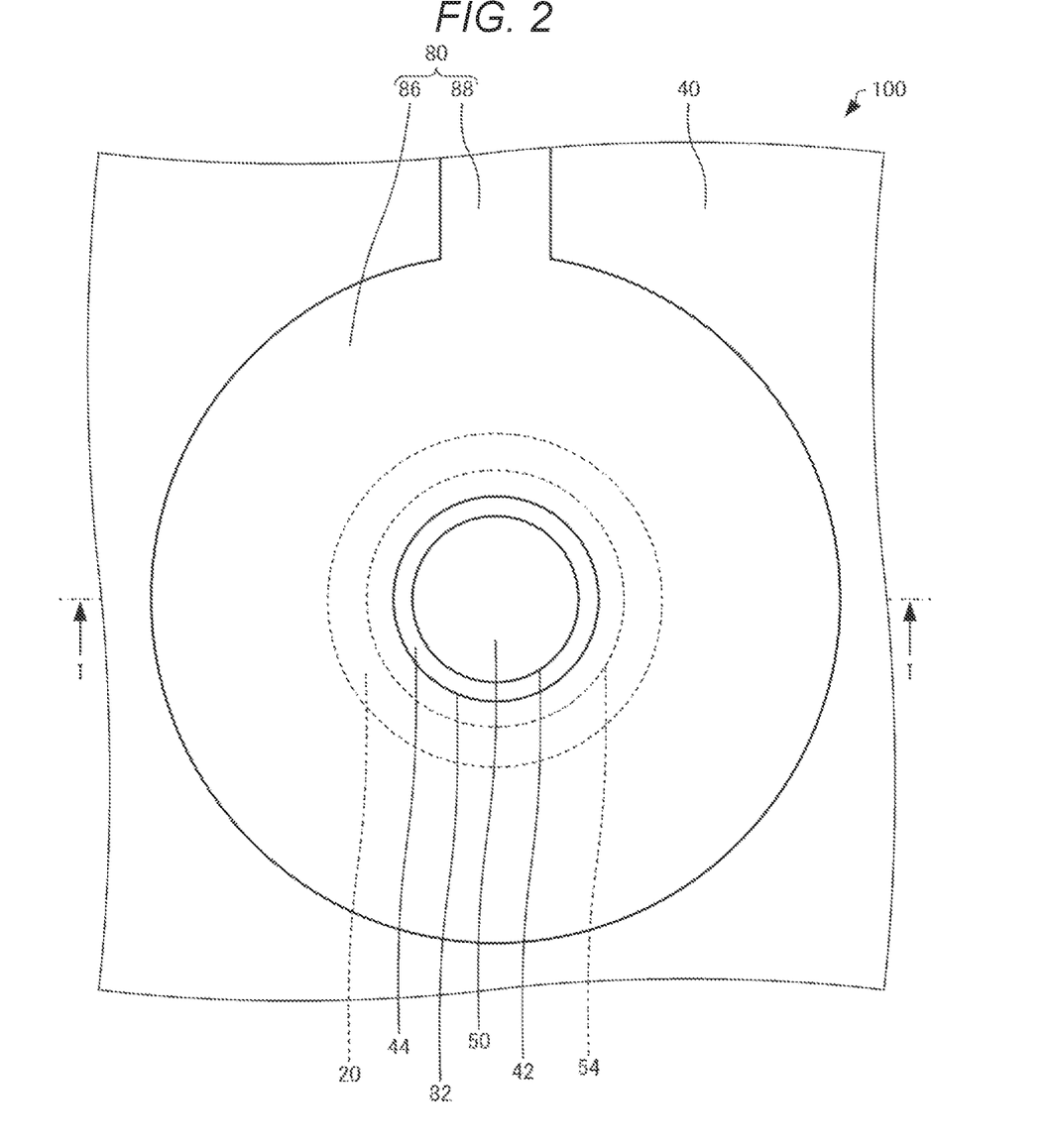
FIG. 2 is a plan view schematically showing the light emitting device according to the embodiment.

First, a light emitting device according to the present embodiment will be described with reference to the drawings. FIG. 1 is a cross-sectional view schematically showing a light emitting device 100 according to the present embodiment. FIG. 2 is a plan view schematically showing the light emitting device 100 according to the present embodiment. It should be noted that FIG. 1 is a cross-sectional view along the line I-I shown in FIG. 2.

As shown in FIG. 1 and FIG. 2, the light emitting device 100 has, for example, a substrate 10, a laminated structure 20, an insulating layer 40, a first electrode 50, a second electrode 60, a third electrode 70, and a wiring layer 80. It should be noted that in FIG. 2, an illustration of the second electrode 60 is omitted for the sake of convenience. The light emitting device 100 is, for example, a semiconductor laser.

The substrate 10 is, for example, an Si substrate, a GaN substrate, a sapphire substrate, or an SiC substrate.

The laminated structure 20 is provided to the substrate 10. In the example shown in FIG. 1, the laminated structure 20 is disposed on the substrate 10. The laminated structure 20 has, for example, a buffer layer 22 and a columnar parts 30.

In the present specification, when taking a light emitting layer 34 as a reference in a stacking direction of the laminated structure 20 (hereinafter also referred to simply as a "stacking direction"), the description will be presented assuming a direction from the light emitting layer 34 toward a second semiconductor layer 36 as an "upward direction," and a direction from the light emitting layer 34 toward a first semiconductor layer 32 as a "downward direction." Further, a direction perpendicular to the stacking direction is also referred to as an "in-plane direction." Further, the "stacking direction of the laminated structure 20" means a stacking direction of the first semiconductor layer 32 and the light emitting layer 34 in the columnar part 30. Further, "in the plan view" means when viewed from the stacking direction.

The buffer layer 22 is disposed on the substrate 10. The buffer layer 22 is a semiconductor layer of a first conductivity type. The buffer layer 22 is, for example, an Si-doped n-type GaN layer. Although not shown in the drawings, on the buffer layer 22, there is disposed a mask layer for forming the columnar parts 30. The mask layer is, for example, a silicon oxide layer, a titanium layer, a titanium oxide layer, or an aluminum oxide layer.

The columnar parts 30 are disposed on the buffer layer 22. The columnar parts 30 each have a columnar shape protruding upward from the buffer layer 22. In other words, the columnar parts 30 protrude upward from the substrate 10 via the buffer layer 22. The columnar part 30 is also referred to as, for example, a nano-column, a nano-wire, a nano-rod, or a nano-pillar. The planar shape of the columnar part 30 is, for example, a polygon or a circle.

The diametrical size of the columnar part 30 is, for example, no smaller than 50 nm and no larger than 500 nm. By setting the diametrical size of the columnar part 30 to be no larger than 500 nm, it is possible to obtain the light emitting layer 34 made of crystal high in quality, and at the same time, it is possible to reduce a distortion inherent in the light emitting layer 34. Thus, it is possible to amplify light generated in the light emitting layer 34 with high efficiency.

It should be noted that when the planar shape of the columnar part 30 is a circle, the "diametrical size of the columnar part" means the diameter of the circle, and when the planar shape of the columnar part 30 is not a circular shape, the "diametrical size of the columnar part" means the diameter of the minimum bounding circle. For example, when the planar shape of the columnar part 30 is a polygonal shape, the diametrical size of the columnar part 30 is the diameter of a minimum circle including the polygonal shape inside, and when the planar shape of the columnar part 30 is an ellipse, the diametrical size of the columnar part 30 is the diameter of a minimum circle including the ellipse inside.

There is disposed a plurality of the columnar parts 30. An interval between the columnar parts 30 adjacent to each other is, for example, no smaller than 1 nm and no larger than 500 nm. The plurality of columnar parts 30 are arranged at a predetermined pitch in a predetermined direction in the plan view. The plurality of columnar parts 30 are arranged so as to form, for example, a triangular lattice or a square lattice. The plurality of columnar parts 30 can develop an effect of a photonic crystal.

It should be noted that the "pitch of the columnar parts" means a distance between the centers of the columnar parts 30 adjacent to each other along the predetermined direction. When the planar shape of the columnar part 30 is a circle, the "center of the columnar part" means the center of the circle, and when the planar shape of the columnar part 30 is not a circular shape, the "center of the columnar part" means the center of the minimum bounding circle. For example, when the planar shape of the columnar part 30 is a polygonal shape, the center of the columnar part 30 is the center of a minimum circle including the polygonal shape inside, and when the planar shape of the columnar part 30 is an ellipse, the center of the columnar part 30 is the center of a minimum circle including the ellipse inside.

The columnar parts 30 each have the first semiconductor layer 32, the light emitting layer 34, and the second semiconductor layer 36.

The first semiconductor layer 32 is disposed on the buffer layer 22. The first semiconductor layer 32 is disposed between the substrate 10 and the light emitting layer 34. The first semiconductor layer 32 is the semiconductor layer of the first conductivity type. The first semiconductor layer 32 is, for example, an Si-doped n-type GaN layer.

The light emitting layer 34 is disposed on the first semiconductor layer 32. The light emitting layer 34 is disposed between the first semiconductor layer 32 and the second semiconductor layer 36. The light emitting layer 34 generates light in response to injection of an electrical current. The light emitting layer 34 has, for example, well layers and barrier layers. The well layers and the barrier layers are each an i-type semiconductor layer which is not intentionally doped with any impurity. The well layers are each, for example, an InGaN layer. The barrier layers are each, for example, a GaN layer. The light emitting layer 34 has an MQW (Multiple Quantum Well) structure constituted by the well layers and the barrier layers.

It should be noted that the number of the well layers and the barrier layers constituting the light emitting layer 34 is not particularly limited. For example, the number of the well layers disposed can be one, and in this case, the light emitting layer 34 has an SQW (Single Quantum Well) structure.

The second semiconductor layer 36 is disposed on the light emitting layer 34. The second semiconductor layer 36 is a semiconductor layer of a second conductivity type different from the first conductivity type. The second semiconductor layer 36 is, for example, an Mg-doped p-type GaN layer. The first semiconductor layer 32 and the second semiconductor layer 36 are cladding layers having a function of confining the light in the light emitting layer 34.

It should be noted that although not shown in the drawings, an OCL (Optical Confinement Layer) consisting of an i-type InGa layer and a GaN layer can be disposed at least one of between the first semiconductor layer 32 and the light emitting layer 34 and between the light emitting layer 34 and the second semiconductor layer 36. Further, the second semiconductor layer 36 can be provided with an EBL (Electron Blocking Layer) formed of a p-type AlGaN layer.

In the light emitting device 100, a pin diode is constituted by the second semiconductor layer 36 of the p-type, the light emitting layer 34 of the i-type, and the first semiconductor layer 32 of the n-type. In the light emitting device 100, when a forward bias voltage of the pin diode is applied between the first electrode 50 and the third electrode 70, an electrical current is injected into the light emitting layer 34, and recombination of electrons and holes occurs in the light emitting layer 34. The recombination causes light emission. The light generated in the light emitting layer 34 propagates in an in-plane direction to form a standing wave due to the effect of the photonic crystal caused by the plurality of columnar parts 30, and is then gained by the light emitting layer 34 to cause laser oscillation. Then, the light emitting device 100 emits positive first-order diffracted light and negative first-order diffracted light as a laser beam in the stacking direction.

It should be noted that it is also possible to dispose a reflecting layer between the substrate 10 and the buffer layer 22, or below the substrate 10 although not shown in the drawings. The reflecting layer is, for example, a DBR (Distributed Bragg Reflector) layer. Due to the reflecting layer, it is possible to reflect the light generated in the light emitting layer 34, and thus, it is possible for the light emitting device 100 to emit the light only from the first electrode 50 side.

The insulating layer 40 covers the laminated structure 20. In the illustrated example, the insulating layer 40 covers a part of the buffer layer 22, some of the columnar parts 30, and a part of the first electrode 50. The thickness of the insulating layer 40 is, for example, no smaller than 1 μm. The insulating layer 40 is, for example, a polyimide layer or a silicon oxide layer.

The first electrode 50 is disposed on the second semiconductor layer 36. The first electrode 50 is electrically coupled to the second semiconductor layer 36. It is also possible for the second semiconductor layer 36 to have ohmic contact with the first electrode 50.

The second electrode 60 is disposed on the first electrode 50 and the insulating layer 40. The first electrode 50 and the second electrode 60 are one electrodes for injecting the electrical current into the light emitting layer 34. The details of the first electrode 50 and the second electrode 60 will be described later.

The third electrode 70 is disposed on the buffer layer 22. It is also possible for the buffer layer 22 to have ohmic contact with the third electrode 70. The third electrode 70 is electrically coupled to the first semiconductor layer 32. In the illustrated example, the third electrode 70 is electrically coupled to the first semiconductor layer 32 via the buffer layer 22. The third electrode 70 is the other electrode for injecting the electrical current into the light emitting layer 34. The third electrode 70 is a laminated structure having, for example, a Cr layer and an Ni layer stacked from the buffer layer 22 side.

The wiring layer 80 is disposed on the second electrode 60 and the insulating layer 40. The wiring layer 80 is electrically coupled to the first electrode 50 via the second electrode 60. The details of the wiring layer 80 will be described later.

It should be noted that although the light emitting layer 34 of the InGaN type is described above, as the light emitting layer 34, there can be used a variety of types of material system capable of emitting light in response to injection of an electrical current in accordance with the wavelength of the light to be emitted. It is possible to use semiconductor materials of, for example, an AlGaN type, an AlGaAs type, an InGaAs type, an InGaAsP type, an InP type, a GaP type, or an AlGaP type.

Further, although it is assumed in the above description that an air gap is disposed between the columnar parts 30 adjacent to each other, it is possible for the laminated structure 20 to have a light propagation layer for propagating the light generated in the light emitting layer 34 between the columnar parts 30 adjacent to each other. The light propagation layer is, for example, a silicon oxide layer, an aluminum oxide layer, or a titanium oxide layer.

Further, in the above description, there is described the example in which the laminated structure 30 has the plurality of columnar parts 30, but it is possible for the laminated structure 20 to be constituted by the first semiconductor layer 32 shaped like a film, the light emitting layer 34 shaped like a film, and the second semiconductor layer 36 shaped like a film without having the plurality of columnar parts 30.

Further, the light emitting device 100 is not limited to the laser, and can also be an LED (Light Emitting Diode).

1.2. Wiring Layer, Electrodes, etc.

The wiring layer 80 is provided with a first opening part 82. In the example shown in FIG. 2, the shape of the first opening part 82 is a circle. The first opening part 82 is defined by a side surface 84 of the wiring layer 80. The first opening part 82 penetrates the wiring layer 80. The first opening part 82 is an opening part which the light emitted from the laminated structure 20 passes through. In the illustrated example, the wiring layer 80 has a ring-like part 86 having a ring-like shape, and an extending part 88 extending outward from the ring-like part 86. Although not shown in the drawings, the extending part 88 is coupled to, for example, a bonding wire or an FPC (Flexible Printed Circuits).

The wiring layer 80 has a light shielding property with respect to the light generated in the light emitting layer 34. Therefore, the wiring layer 80 blocks the light emitted from the laminated structure 20. The wiring layer 80 does not transmit the light emitted from the laminated structure 20. The transmittance of the wiring layer 80 with respect to the light generated in the light emitting layer 34 is lower than the transmittance of the first electrode 50 with respect to the light generated in the light emitting layer 34.

The electrical resistivity of the wiring layer 80 is lower than the electrical resistivity of the second electrode 60. The wiring layer 80 is a metal wiring layer. The wiring layer 80 is a laminated structure having, for example, a Cr layer, an Ni layer, and an Au layer stacked from the insulating layer 40 side. The thickness of the Cr layer is, for example, 20 nm. The thickness of the Ni layer is, for example, 30 nm. The thickness of the Au layer is, for example, 200 nm. When the thickness of the wiring layer 80 is no smaller than 200 nm, it is possible to more surely block the light emitted from the laminated structure 20.

The insulating layer 40 is provided with a second opening part 42. In the example shown in FIG. 2, the shape of the second opening part 42 is a circle. The second opening part 42 penetrates the insulating layer 40. The second opening part 42 is defined by a side surface 44 of the insulating layer 40. Further, a bottom surface of the second opening part 42 is defined by an upper surface of the first electrode 50. On the side surface 44, there is disposed the second electrode 60. In the illustrated example, the wiring layer 80 is not disposed in the second opening part 42. In the plan view, the area of the second opening part 42 is smaller than the area of the first opening part 82, and the whole of the second opening part 42 overlaps the first opening part 82.

The first electrode 50 is disposed at the opposite side to the substrate 10 of the laminated structure 20. The first electrode 50 has contact with the laminated structure 20. The first electrode 50 is disposed between the laminated structure 20 and the second electrode 60.

Figure 3:
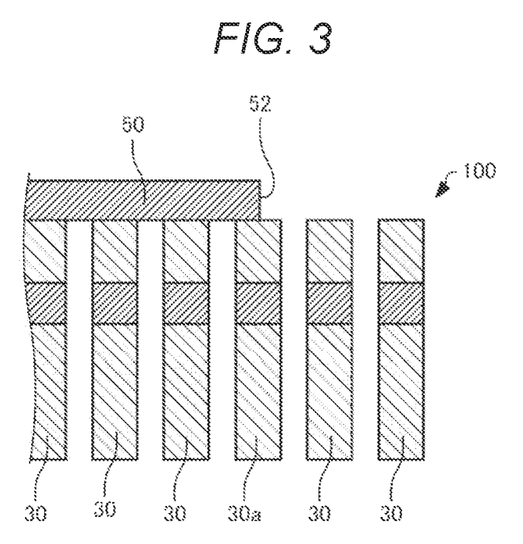
FIG. 3 is a cross-sectional view schematically showing the light emitting device according to the embodiment.

Here, FIG. 3 is a cross-sectional view schematically showing the vicinity of a side surface 52 of the first electrode 50. In FIG. 3, an illustration of members other than the columnar parts 30 and the first electrode 50 is omitted for the sake of convenience. As shown in FIG. 3, a first columnar part 30a out of the plurality of columnar parts 30 has a portion covered with the first electrode 50 and a portion not covered with the first electrode 50. The first columnar part 30a is disposed below the side surface 52 of the first electrode 50. In the plan view, the first columnar part 30a overlaps an outer edge 54 of the first electrode 50. In the plan view, the whole of the first columnar part 30a overlaps the wiring layer 80. As shown in FIG. 2, in the plan view, the first opening part 82 and the second opening part 42 are located inside the outer edge 54. In the plan view, the outer edge 54 overlaps the wiring layer 80. In the illustrated example, the whole of the outer edge 54 overlaps the wiring layer 80 in the plan view. The side surface 52 of the first electrode 50 forms, for example, the outer edge 54.

The electrical resistivity of the first electrode 50 is lower than the electrical resistivity of the second electrode 60. The first electrode 50 transmits the light emitted from the laminated structure 20. The thickness of the first electrode 50 is, for example, no smaller than 5 nm and no larger than 50 nm, and is preferably no smaller than 10 nm and no larger than 30 nm. When the thickness of the first electrode 50 is no smaller than 5 nm, the resistance can be made low. When the thickness of the first electrode 50 is no larger than 50 nm, the transmittance with respect to the light generated in the light emitting layer 34 can be made high.

The first electrode 50 is a laminated structure having, for example, a Pd layer, a Pt layer, and an Au layer stacked from the second semiconductor layer 36 side. The thickness of the Pd layer is, for example, 5 nm. The thickness of the Pt layer is, for example, 5 nm. The thickness of the Au layer is, for example, 10 nm. It should be noted that the first electrode 50 can be a laminated structure having an Ni layer and an Au layer stacked from the second semiconductor layer 36 side.

The second electrode 60 has contact with the first electrode 50. The second electrode 60 does not have contact with the laminated structure 20. The second electrode 60 is disposed in the second opening part 42. In the illustrated example, the second electrode 60 is disposed on an upper surface of the insulating layer 40, the side surface 44 of the insulating layer 40 which defines the second opening part 42, and the upper surface of the first electrode 50. The second electrode 60 is coupled to the first electrode 50 exposed by the second opening part 42. The planar shape of the second electrode 60 is, for example, a circle.

The transmittance of the second electrode 60 with respect to the light generated in the light emitting layer 34 is higher than the transmittance of the first electrode 50 with respect to the light generated in the light emitting layer 34. The second electrode 60 is, for example, transparent with respect to the light generated in light emitting layer 34. The thickness of the second electrode 60 is, for example, no smaller than 100 nm and no larger than 500 nm, and is preferably no smaller than 250 nm and no larger than 350 nm. When the thickness of the second electrode 60 is no smaller than 100 nm, the resistance can be made low. When the thickness of the second electrode 60 is no larger than 500 nm, the transmittance with respect to the light generated in the light emitting layer 34 can be made high. The material of the second electrode 60 is, for example, ITO (Indium Tin Oxide) or IZO (Indium Zinc Oxide).

1.3. Functions and Advantages

In the light emitting device 100, there are provided the laminated structure 20, the first electrode 50, and the wiring layer 80, wherein the laminated structure is disposed on the substrate 10, and has the light emitting layer 34, the first electrode 50 has contact with the laminated structure 20 at the opposite side of the laminated structure 20 to the substrate 10, and injects the electrical current into the light emitting layer 34, and the wiring layer 80 is electrically coupled to the first electrode 50, and has the light shielding property with respect to the light generated in the light emitting layer 34. The wiring layer 80 is provided with the first opening part 82 which the light emitted from the laminated structure 20 passes through, and the first opening part 82 is located inside the outer edge 54 of the first electrode 50 in the plan view.

Therefore, in the light emitting device 100, the light emitted from a portion (the first columnar part 30a in the illustrated example) overlapping the outer edge 54 in the plan view of the laminated structure 20 can be blocked by the wiring layer 80. The portion overlapping the outer edge 54 in the plan view of the laminated structure 20 is thinned in some cases due to, for example, over-etching when forming the first electrode 50. Therefore, the light emitted from the portion overlapping the outer edge 54 in the plan view of the laminated structure 20 is, for example, shifted in wavelength, or deteriorated in emission intensity in some cases. In the light emitting device 100, since it is possible to block such light with the wiring layer 80 to define the light to be emitted from the light emitting device 100 with the first opening part 82, it is possible to reduce the possibility of occurrence of the shift in wavelength and the deterioration in emission intensity.

In the light emitting device 100, the laminated structure 20 has the plurality of columnar parts 30, and each of the columnar parts 30 has the first semiconductor layer 32 having the first conductivity type, the second semiconductor layer 36 having the second conductively type different from the first conductivity type, and the light emitting layer 34 disposed between the first semiconductor layer 32 and the second semiconductor layer 36. Therefore, in the light emitting device 100, it is possible to reduce the distortion inherent in the light emitting layer 34 compared to when the laminated structure does not have the plurality of columnar parts, but has a film-like light emitting layer.

In the light emitting device 100, the first columnar part 30a out of the plurality of columnar parts 30 overlaps the outer edge 54 of the first electrode 50 in the plan view. In the light emitting device 100, even when, for example, the first columnar part 30a is thinned due to over-etching when forming the first electrode 50, the light emitted from the first columnar part 30a can be blocked by the wiring layer 80.

In the light emitting device 100, there is provided the second electrode 60 provided to the first electrode 50, the wiring layer 80 is electrically coupled to the first electrode 50 via the second electrode 60, the electrical resistivity of the first electrode 50 is lower than the electrical resistivity of the second electrode 60, and the transmittance of the second electrode 60 with respect to the light generated in the light emitting layer 34 is higher than the transmittance of the first electrode 50 with respect to the light generated in the light emitting layer 34. Therefore, in the light emitting device 100, it is possible to increase the transmittance of an electrode structure constituted by the first electrode 50 and the second electrode 60 with respect to the light generated in the light emitting layer 34 while reducing the contact resistance between the electrode structure and the laminated structure 20.

2. Method of Manufacturing Light Emitting Device

Figure 4:
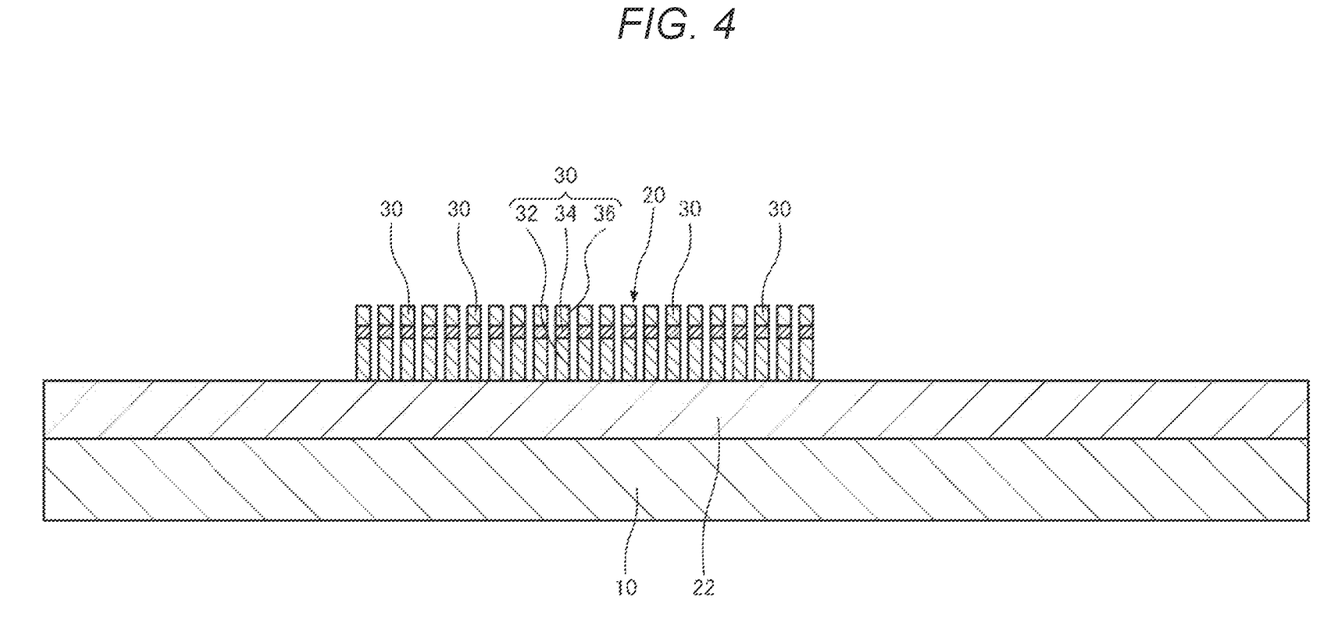
FIG. 4 is a cross-sectional view schematically showing a manufacturing process of the light emitting device according to the embodiment.
Figure 5:
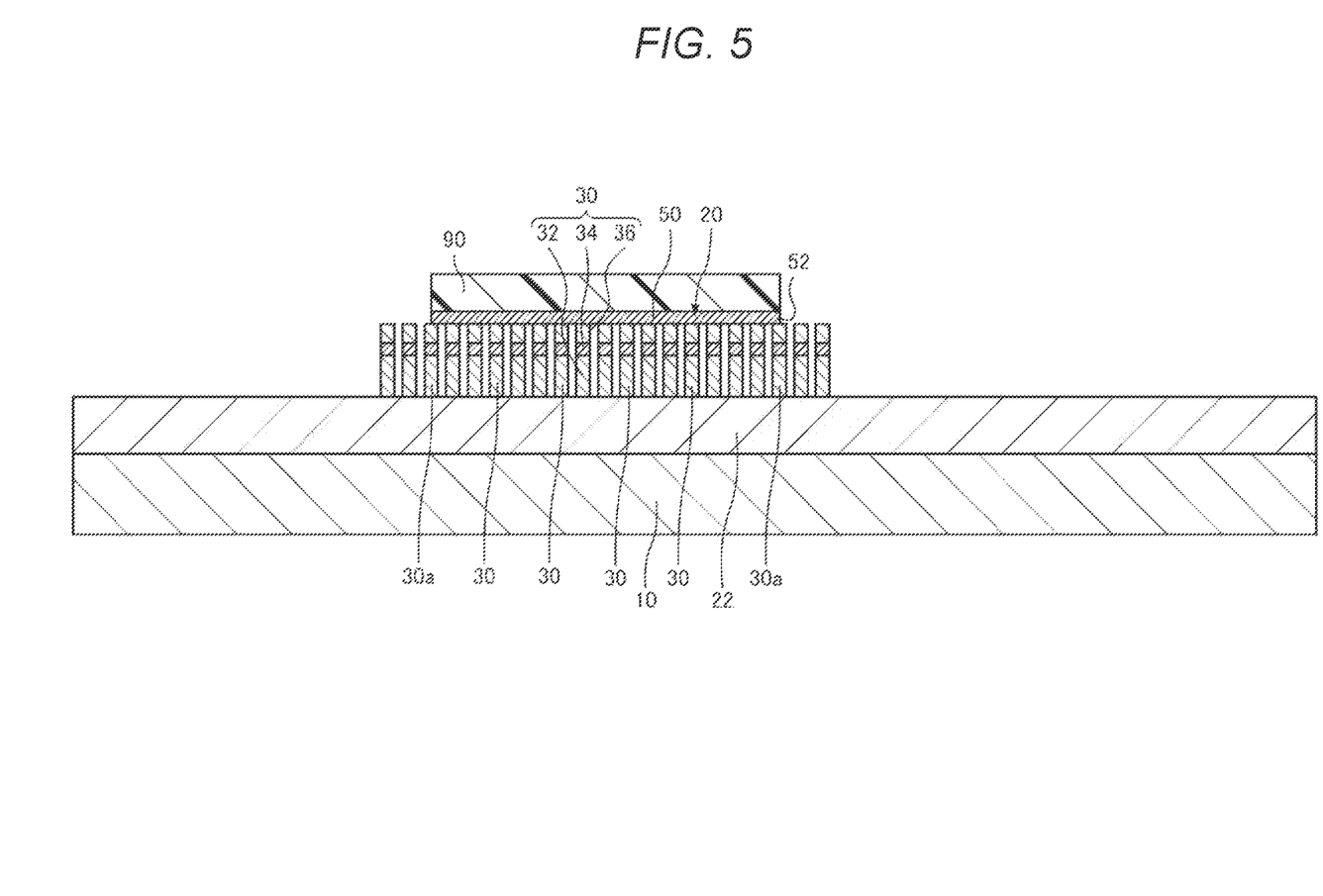
FIG. 5 is a cross-sectional view schematically showing the manufacturing process of the light emitting device according to the embodiment.
Figure 6:
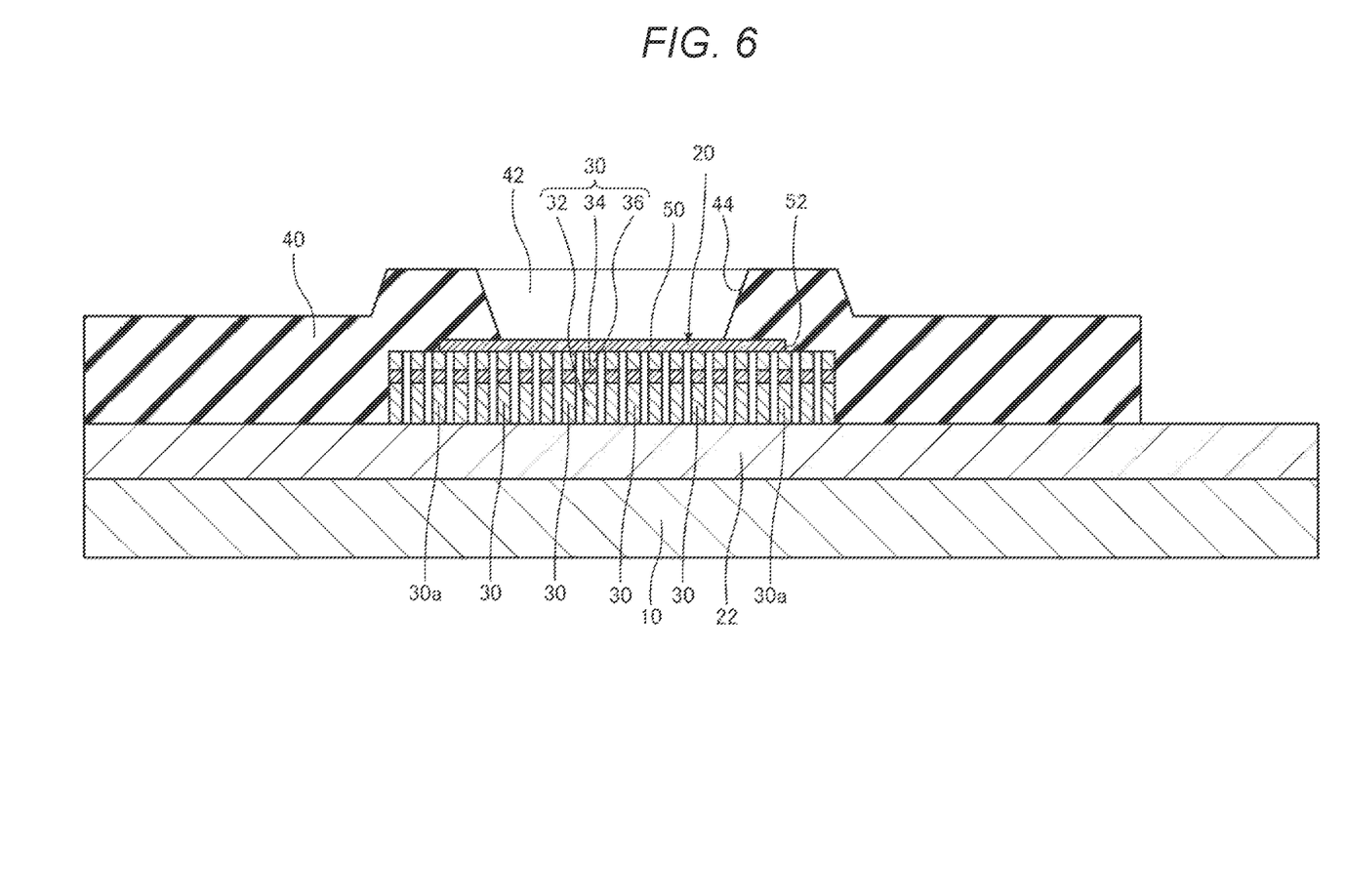
FIG. 6 is a cross-sectional view schematically showing the manufacturing process of the light emitting device according to the embodiment.

Then, a method of manufacturing the light emitting device 100 according to the present embodiment will be described with reference to the drawings. FIG. 4 through FIG. 6 are cross-sectional views schematically showing a manufacturing process of the light emitting device 100 according to the present embodiment.

As shown in FIG. 4, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, a mask layer not shown is formed on the buffer layer 22. The mask layer is formed using, for example, an electron beam evaporation method or a sputtering method.

Then, the first semiconductor layer 32, the light emitting layer 34, and the second semiconductor layer 36 are grown epitaxally in this order on the buffer layer 22 using the mask layer as a mask. As the method of achieving the epitaxial growth, there can be cited, for example, the MOCVD method and the MBE method. Due to the present step, it is possible to form the laminated structure 20 having the plurality of columnar parts 30.

As shown in FIG. 5, the first electrode 50 is formed on the laminated structure 20. The first electrode is formed using, for example, a CVD (Chemical Vapor Deposition) method or a sputtering method. Then, the resist layer 90 having a predetermined shape is formed on the first electrode layer 50. The resist layer 90 is formed using photolithography. Then, a portion not covered with the resist layer 90 of the first electrode 50 is etched using the resist layer 90 as a mask. The etching in the present step is, for example, dry etching. In the present step, over-etching is performed so as to completely remove the portion not covered with the resist layer 90 of the first electrode 50. Therefore, the columnar parts 30 not covered with the resist layer 90 are partially etched.

As shown in FIG. 6, after removing the resist layer 90, the insulating layer 40 is formed so as to cover the laminated structure 20 and the first electrode 50. The insulating layer 40 is formed using, for example, the CVD method or a spin-coating method. Then, pattering is performed on the insulating layer 40 to form the second opening part 42. The patterning is performed using, for example, photolithography and etching.

As shown in FIG. 1, the second electrode 60 is formed on the first electrode 50 and the insulating layer 40. The second electrode 60 is formed using, for example, the CVD method or the sputtering method.

Then, the wiring layer 80 is formed on the second electrode 60 and the insulating layer 40. The wiring layer 80 is formed using, for example, the CVD method or the sputtering method. Then, pattering is performed on the wiring layer 80 to form the first opening part 82. The patterning is performed using, for example, photolithography and etching.

Then, the third electrode 70 is formed on the buffer layer 22. The third electrode 70 is formed using, for example, the CVD method or the sputtering method. It should be noted that the order of the formation of the second electrode 60 and the formation of the third electrode 70 is not particularly limited. Further, the order of the formation of the third electrode 70 and the formation of the wiring layer 80 is not particularly limited.

Due to the steps described hereinabove, it is possible to manufacture the light emitting device 100.

It should be noted that although the example of forming the first electrode 50 using photolithography and etching is described in the above description, it is possible to form the first electrode 50 using a liftoff method. When forming the first electrode 50 using the liftoff method, there is a possibility that the thickness in the vicinity of the outer edge 54 of the first electrode decreases. Therefore, even when forming the first electrode 50 using the liftoff method, it is preferable for the light emitted from the portion overlapping the outer edge 54 in the plan view of the laminated structure 20 to be blocked by the wiring layer 80.

3. Modified Example of Light Emitting Device

Figure 7:
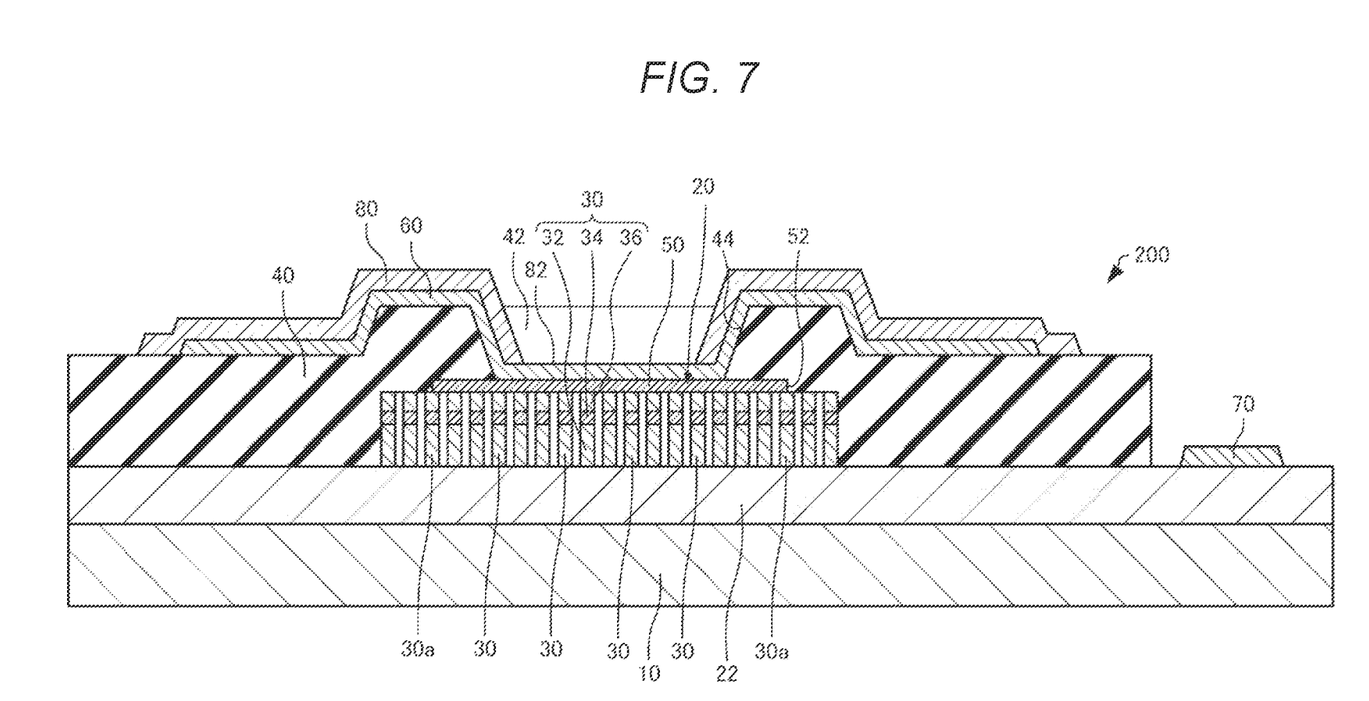
FIG. 7 is a cross-sectional view schematically showing a light emitting device according to a modified example of the present embodiment.
Figure 8:
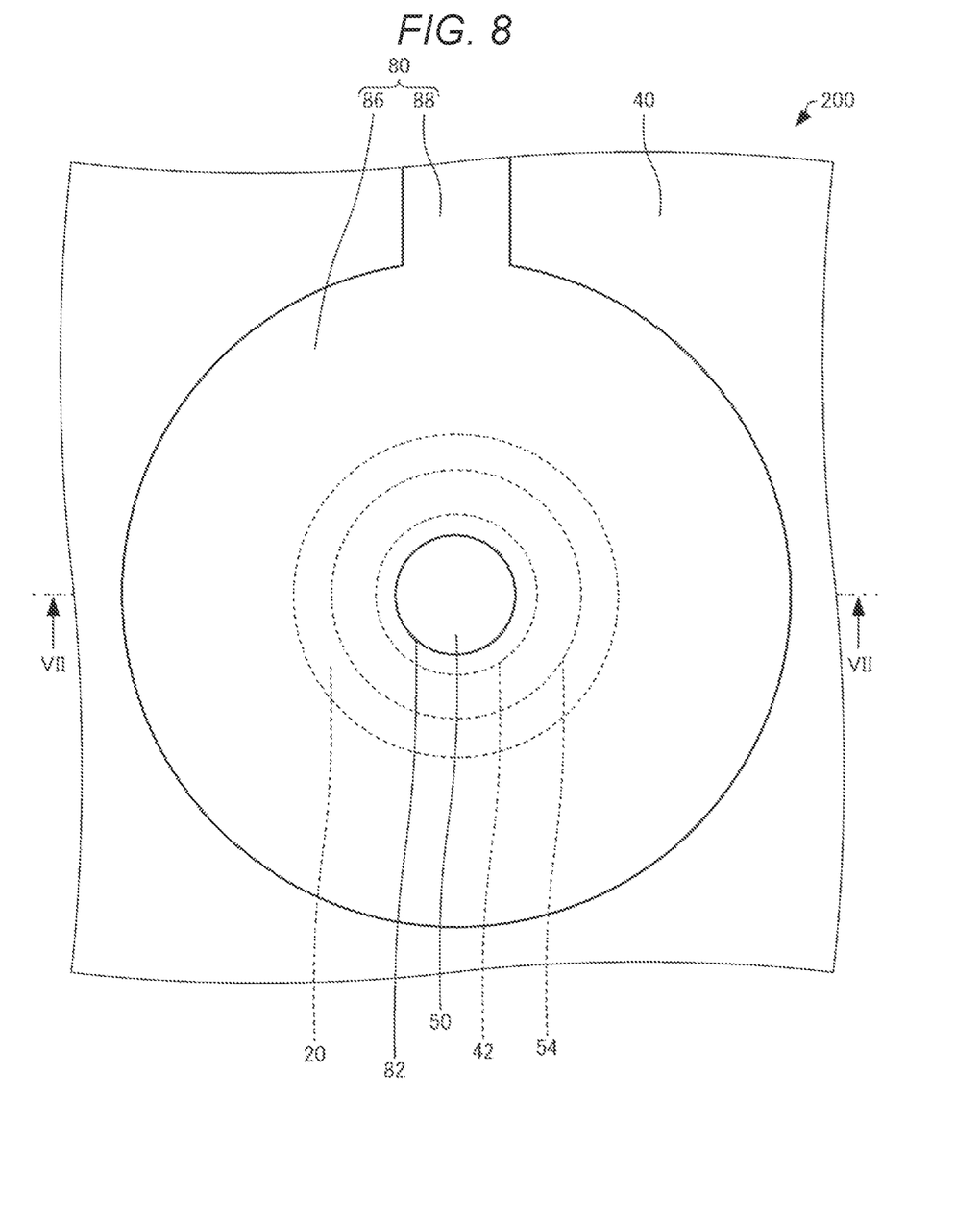
FIG. 8 is a plan view schematically showing the light emitting device according to the modified example of the present embodiment.

Then, a light emitting device according to a modified example of the present embodiment will be described with reference to the drawings. FIG. 7 is a cross-sectional view schematically showing the light emitting device 200 according to the modified example of the present embodiment. FIG. 8 is a plan view schematically showing the light emitting device 200 according to the modified example of the present embodiment. It should be noted that FIG. 7 is a cross-sectional view along the line VII-VII shown in FIG. 8. Further, in FIG. 8, the illustration of the second electrode 60 is omitted for the sake of convenience.

Hereinafter, in the light emitting device 200 according to the modified example of the present embodiment, the constituents thereof having substantially the same functions as those of the constituents of the light emitting device 100 according to the present embodiment described above will be denoted by the same reference symbols, and detailed descriptions thereof will be omitted.

In the light emitting device 100 described above, as shown in FIG. 1, the wiring layer 80 is not disposed in the second opening part 42. In contrast, in the light emitting device 200, the wiring layer 80 is disposed in the second opening part 42 as shown in FIG. 7.

In the light emitting device 200, the wiring layer 80 is disposed on the side surface 44 of the insulating layer 40 via the second electrode 60. As shown in FIG. 8, the area of the first opening part 82 is smaller than the area of the second opening part 42, and the whole of the first opening part 82 overlaps the second opening part 42 in the plan view.

In the light emitting device 200, there is provided the insulating layer 40 covering the laminated structure 20, the insulating layer 40 is provided with the second opening part 42, the second opening part 42 is disposed inside the outer edge 54 of the first electrode 50 in the plan view, the second electrode 60 is disposed on the side surface 44 of the insulating layer 40 defining the second opening part 42, the wiring layer 80 is disposed on the side surface 44 via the second electrode 60, and the electrical resistivity of the wiring layer 80 is lower than the electrical resistivity of the second electrode 60. Therefore, in the light emitting device 200, the distance between the wiring layer 80 low in electrical resistivity and the first electrode 50 can be made shorter compared to when the wiring layer is not disposed on the side surface of the insulating layer via the second electrode. Thus, it is possible to efficiently inject the electrical current into the light emitting layer 34.

4. Projector

Figure 9:
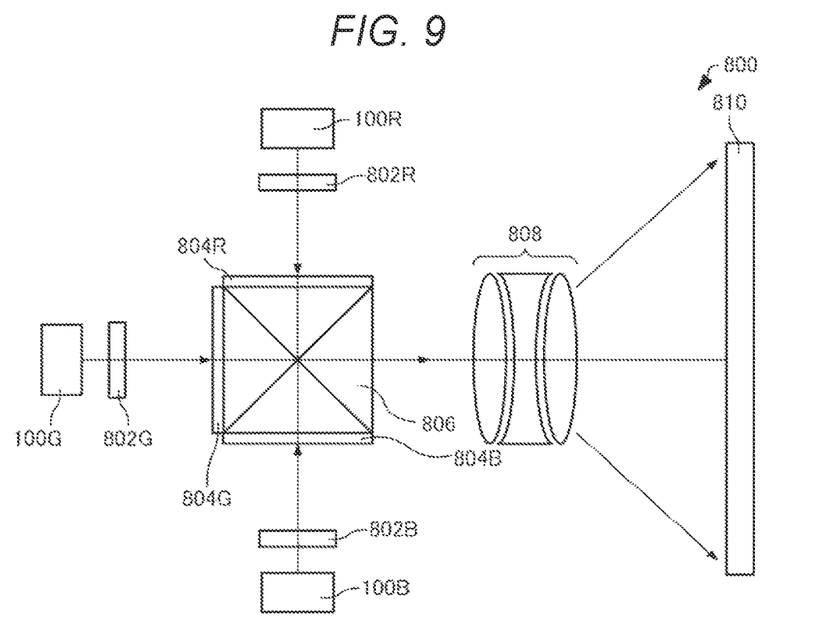
FIG. 9 is a diagram schematically showing a projector according to the embodiment.

Then, a projector according to the present embodiment will be described with reference to the drawings. FIG. 9 is a diagram schematically showing the projector 800 according to the present embodiment.

The projector 800 has, for example, the light emitting devices 100 as light sources.

The projector 800 includes a housing not shown, a red light source 100R, a green light source 100G, and a blue light source 100B which are disposed inside the housing, and respectively emit red light, green light, and blue light. It should be noted that in FIG. 9, the red light source 100R, the green light source 100G, and the blue light source 100B are simplified for the sake of convenience.

The projector 800 further includes a first optical element 802R, a second optical element 802G, a third optical element 802B, a first light modulation device 804R, a second light modulation device 804G, a third light modulation device 804B, and a projection device 808 all installed inside the housing. The first light modulation device 804R, the second light modulation device 804G, and the third light modulation device 804B are each, for example, a transmissive liquid crystal light valve. The projection device 808 is, for example, a projection lens.

The light emitted from the red light source 100R enters the first optical element 802R. The light emitted from the red light source 100R is collected by the first optical element 802R. It should be noted that the first optical element 802R can be provided with other functions than the light collection. The same applies to the second optical element 802G and the third optical element 802B described later.

The light collected by the first optical element 802R enters the first light modulation device 804R. The first light modulation device 804R modulates the incident light in accordance with image information. Then, the projection device 808 projects an image formed by the first light modulation device 804R on a screen 810 in an enlarged manner.

The light emitted from the green light source 100G enters the second optical element 802G. The light emitted from the green light source 100G is collected by the second optical element 802G.

The light collected by the second optical element 802G enters the second light modulation device 804G. The second light modulation device 804G modulates the incident light in accordance with the image information. Then, the projection device 808 projects an image formed by the second light modulation device 804G on the screen 810 in an enlarged manner.

The light emitted from the blue light source 100B enters the third optical element 802B. The light emitted from the blue light source 100B is collected by the third optical element 802B.

The light collected by the third optical element 802B enters the third light modulation device 804B. The third light modulation device 804B modulates the incident light in accordance with the image information. Then, the projection device 808 projects an image formed by the third light modulation device 804B on the screen 810 in an enlarged manner.

Further, it is possible for the projector 800 to include a cross dichroic prism 806 for combining the light emitted from the first light modulation device 804R, the light emitted from the second light modulation device 804G, and the light emitted from the third light modulation device 804B with each other to guide the light thus combined to the projection device 808.

The three colors of light respectively modulated by the first light modulation device 804R, the second light modulation device 804G, and the third light modulation device 804B enter the cross dichroic prism 806. The cross dichroic prism 806 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 810 by the projection device 808, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 804R, the second light modulation device 804G, and the third light modulation device 804B. Then, it is also possible for the projection device 808 to project the images formed by the red light source 100R, the green light source 100G, and the blue light source 100B on the screen 810 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

5. Display

Figure 10:
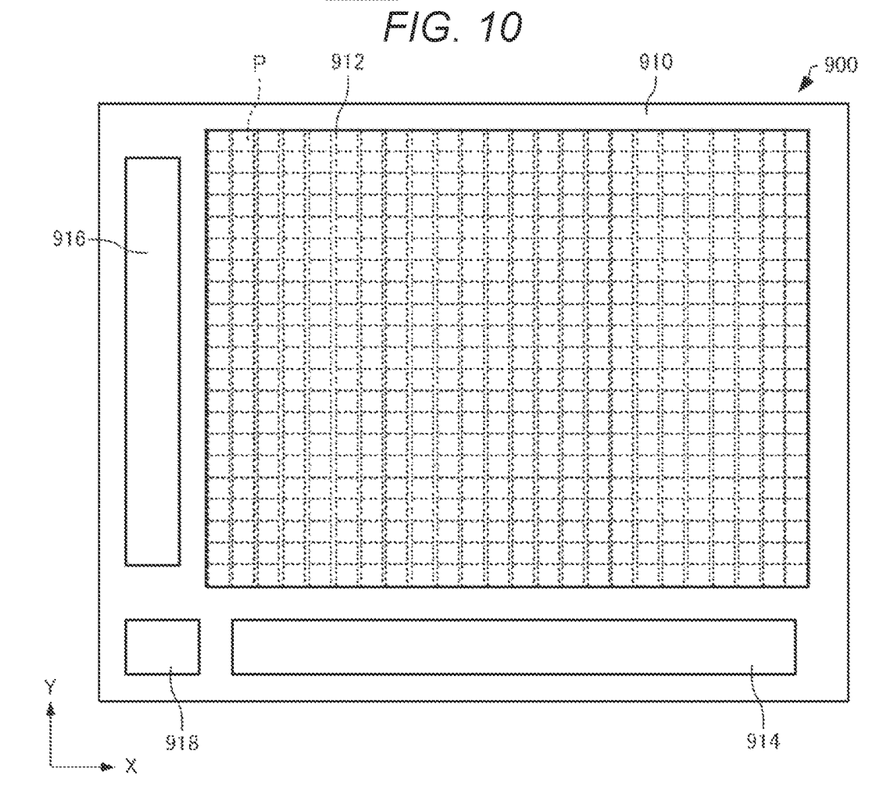
FIG. 10 is a plan view schematically showing a display according to the embodiment.
Figure 11:
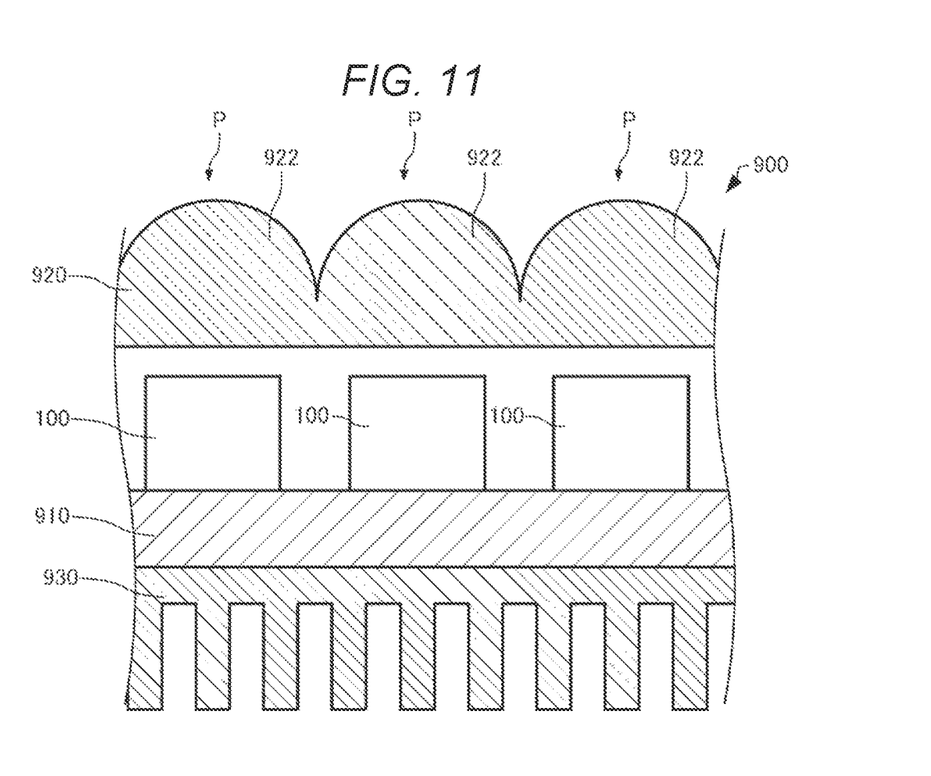
FIG. 11 is a cross-sectional view schematically showing the display according to the embodiment.

Then, a display according to the present embodiment will be described with reference to the drawings. FIG. 10 is a plan view schematically showing a display 900 according to the present embodiment. FIG. 11 is a cross-sectional view schematically showing the display 900 according to the present embodiment. It should be noted that in FIG. 10, an X axis and a Y axis are illustrated as two axes perpendicular to each other for the sake of convenience.

The display 900 has, for example, the light emitting device 100 as a light source.

The display 900 is a display device for displaying an image. The image includes what displays only character information. The display 900 is a self-luminous type display. The display 900 has a circuit board 910, a lens array 920, and a heatsink 930 as shown in FIG. 10 and FIG. 11.

On the circuit board 910, there is mounted a drive circuit for driving the light emitting device 100. The drive circuit is a circuit includes, for example, a CMOS (Complementary Metal Oxide Semiconductor). The drive circuit drives the light emitting device 100 based on, for example, the image information input. Although not shown in the drawings, on the circuit board 910, there is disposed a light transmissive substrate for protecting the circuit board 910.

The circuit board 910 has a display area 912, a data line drive circuit 914, a scanning line drive circuit 916, and a control circuit 918.

The display area 912 is formed of a plurality of pixels P. The pixels P are arranged along the X axis and the Y axis in the illustrated example.

Although not shown in the drawings, the circuit board 910 is provided with a plurality of scanning lines and a plurality of data lines. For example, the scanning lines extend along the X axis, and the data lines extend along the Y axis. The scanning lines are coupled to the scanning line drive circuit 916. The data lines are coupled to the data line drive circuit 914. The pixels P are disposed so as to correspond to the respective intersections between the scanning lines and the data lines.

Each of the pixels P has, for example one light emitting device 100, one lens 922, and a pixel circuit not shown. The pixel circuit includes a switching transistor functioning as a switch for the pixel P, wherein the gate of the switching transistor is coupled to the scanning line, and one of the source and the drain thereof is coupled to the data line.

The data line drive circuit 914 and the scanning line drive circuit 916 are circuits for controlling the drive of the light emitting device 100 constituting the pixel P. The control circuit 918 controls the display of the image.

The control circuit 918 is supplied with image data from a higher-level circuit. The control circuit 918 supplies a variety of signals based on the image data to the data line drive circuit 914 and the scanning line drive circuit 916.

When the scanning line drive circuit 916 activates a scanning signal to thereby select the scanning line, the switching transistor of the pixel P thus selected is set to an ON state. On this occasion, by the data line drive circuit 914 supplying the pixel P thus selected with the data signal from the data line, the light emitting device 100 of the pixel P thus selected emits light in accordance with the data signal.

The lens array 920 has a plurality of lenses 922. The lens 922 is disposed, for example, so as to correspond one-to-one to the light emitting device 100. The light emitted from the light emitting device 100 enters one lens 922.

The heatsink 930 has contact with the circuit board 910. The material of the heatsink 930 is metal such as copper or aluminum. The heatsink 930 releases heat generated in the light emitting device 100.

The light emitting device according to the embodiment described above can also be used for other devices than the projector and the display. As the applications other than the projector and the display, there can be cited a light source of, for example, indoor and outdoor illumination, a laser printer, a scanner, an in-car light, sensing equipment using light, or communication equipment.

The embodiment and the modified example described above are illustrative only, and the present disclosure is not limited to the embodiment and the modified example. For example, it is also possible to arbitrarily combine the embodiment and the modified example with each other.

The present disclosure includes configurations substantially the same as the configuration described as the embodiment, for example, configurations having the same function, the same way, and the same result, or configurations having the same object and the same advantage. Further, the present disclosure includes configurations obtained by replacing a non-essential part of the configuration described as the embodiment. Further, the present disclosure includes configurations providing the same functions and advantages, and configurations capable of achieving the same object as those of the configuration described as the embodiment. Further, the present disclosure includes configurations obtained by adding a known technology to the configuration described as the embodiment.

The following contents derive from the embodiment and the modified example described above.

A light emitting device according to an aspect includes a substrate, a laminated structure which is provided to the substrate, and includes a light emitting layer, a first electrode which has contact with the laminated structure at an opposite side of the laminated structure to the substrate, and is configured to inject an electrical current into the light emitting layer, and a wiring layer which is electrically coupled to the first electrode, and has a light shielding property with respect to light generated in the light emitting layer, wherein the wiring layer is provided with a first opening part which the light emitted from the laminated structure passes through, and the first opening part is located inside an outer edge of the first electrode in a plan view.

According to this light emitting device, it is possible to block the light emitted from a portion of the laminated structure overlapping the outer edge of the first electrode in the plan view.

In the light emitting device according to the aspect, the laminated structure may include a plurality of columnar parts, and each of the columnar parts may include a first semiconductor layer of a first conductivity type, a second semiconductor layer of a second conductivity type different from the first conductivity type, and the light emitting layer disposed between the first semiconductor layer and the second semiconductor layer.

According to this light emitting device, it is possible to reduce the distortion inherent in the light emitting layer.

In the light emitting device according to the aspect, a first columnar part out of the plurality of columnar parts may overlap the outer edge of the first electrode in the plan view.

According to this light emitting device, it is possible to block the light emitted from the first columnar part with the wiring layer.

In the light emitting device according to the aspect, there may further be included a second electrode provided to the first electrode, wherein the wiring layer may electrically be coupled to the first electrode via the second electrode, the first electrode may be lower in electrical resistivity than the second electrode, and the second electrode may be higher in transmittance with respect to the light generated in the light emitting layer than the first electrode.

According to this light emitting device, it is possible to increase the transmittance of an electrode structure constituted by the first electrode and the second electrode with respect to the light generated in the light emitting layer while reducing the contact resistance between the electrode structure and the laminated structure.

In the light emitting device according to the aspect, there may further be included an insulating layer configured to cover the laminated structure, wherein the insulating layer may be provided with a second opening part, the second opening part may be disposed inside the outer edge of the first electrode in the plan view, the second electrode may be disposed on a side surface of the insulating layer defining the second opening part, the wiring layer may be disposed on the side surface via the second electrode, and the wiring layer may be lower in electrical resistivity than the second electrode.

According to this light emitting device, it is possible to shorten the distance between the wiring layer and the first electrode. Thus, it is possible to efficiently inject the electrical current into the light emitting layer.

A projector according to an aspect includes the light emitting device according to the above aspect.

A display according to an aspect includes the light emitting device according to the above aspect.

What is claimed is:

1. A light emitting device comprising:
   a substrate;
   a laminated structure which is provided to the substrate, the laminated structure being configured with a plurality of columnar parts, each of the plurality of columnar parts including a light emitting layer;
   a first electrode disposed on a top of the laminated structure, the first electrode being configured to inject an electrical current into the light emitting layers of only some columnar parts of the plurality of columnar parts, the first electrode being located inside of an outer periphery of the plurality of columnar parts in a plan view; and
   a wiring layer disposed over the first electrode, the wiring layer being electrically coupled to the first electrode, the wiring layer having a light shielding property with respect to light generated in the light emitting layers of the some columnar parts of the plurality of columnar parts, wherein
   the wiring layer is provided with a first opening part through which the light emitted from the laminated structure passes, and
   the first opening part is located at an inside of an outer periphery of the first electrode in the plan view.

2. The light emitting device according to claim 1, wherein each of the plurality of columnar parts includes:
   a first semiconductor layer of a first conductivity type;

a second semiconductor layer of a second conductivity type different from the first conductivity type; and the light emitting layer disposed between the first semiconductor layer and the second semiconductor layer.

3. The light emitting device according to claim 2, wherein a first columnar part of the plurality of columnar parts overlaps the outer periphery of the first electrode in the plan view.

4. The light emitting device according to claim 1, further comprising:

a second electrode provided to the first electrode, wherein the wiring layer is electrically coupled to the first electrode via the second electrode, the first electrode is lower in electrical resistivity than the second electrode, and the second electrode is higher in transmittance with respect to the light generated in the light emitting layers of the some columnar parts than the first electrode.

5. The light emitting device according to claim 4, further comprising:

an insulating layer configured to cover the laminated structure, wherein the insulating layer is provided with a second opening part, the second opening part is disposed at an inside of the outer periphery of the first electrode in the plan view, the second electrode is disposed on a side surface of the insulating layer defining the second opening part, the wiring layer is disposed over the side surface of the insulating layer via the second electrode, and the wiring layer is lower in electrical resistivity than the second electrode.

6. A projector comprising:
the light emitting device according to claim 1.

7. A display comprising:
the light emitting device according to claim 1.

* * * * *